United States Patent
Yamanishi et al.

(10) Patent No.: US 8,247,289 B2
(45) Date of Patent: Aug. 21, 2012

(54) CAPACITOR AND MANUFACTURING METHOD THEREOF

(75) Inventors: Yoshiki Yamanishi, Sanda (JP); Muneo Harada, Nishinomiya (JP); Takahiro Kitano, Kumamoto (JP); Tatsuzo Kawaguchi, Sendai (JP); Yoshihiro Hirota, Kyoto (JP); Kinji Yamada, Tokyo (JP); Tomotaka Shinoda, Tokyo (JP); Katsuya Okumura, Tokyo (JP); Shuichi Kawano, Kawasaki (JP)

(73) Assignee: Ibiden Co., Ltd., Gifu (JP)

( * ) Notice: Subject to any disclaimer, the term of this patent is extended or adjusted under 35 U.S.C. 154(b) by 425 days.

(21) Appl. No.: 11/508,141

(22) Filed: Aug. 23, 2006

(65) Prior Publication Data
US 2007/0181928 A1 Aug. 9, 2007

(30) Foreign Application Priority Data
Aug. 24, 2005 (JP) ................. 2005-243180

(51) Int. Cl.
  H01L 21/8242 (2006.01)
  H01L 21/20 (2006.01)
  H01L 21/00 (2006.01)
(52) U.S. Cl. ........ 438/240; 438/250; 438/393; 438/796; 257/E21.008; 257/E21.647
(58) Field of Classification Search ............... 438/250, 438/240, 393, 796; 257/E21.008, E21.647
See application file for complete search history.

(56) References Cited

U.S. PATENT DOCUMENTS

| | | | |
|---|---|---|---|
| 4,804,490 A * | 2/1989 | Pryor et al. | 438/796 |
| 5,530,288 A | 6/1996 | Stone | |
| 5,648,663 A * | 7/1997 | Kitahara et al. | 257/59 |
| 5,717,250 A * | 2/1998 | Schuele et al. | 257/754 |
| 5,726,098 A * | 3/1998 | Tsuboi | 438/622 |

(Continued)

FOREIGN PATENT DOCUMENTS

| EP | 1 204 142 A2 | 5/2002 |
|---|---|---|
| JP | 11-274408 | 10/1999 |
| JP | 2002-124636 | 4/2002 |
| JP | 2005-123250 | 5/2005 |

OTHER PUBLICATIONS

European Search Report for Application No. 06017631.0 dated Mar. 27, 2008.

(Continued)

Primary Examiner — Charles Garber
Assistant Examiner — Ron Pompey
(74) Attorney, Agent, or Firm — Finnegan, Henderson, Farabow, Garrett & Dunner, L.L.P.

(57) ABSTRACT

A capacitor having a high quality and a manufacturing method of the same are provided.

A capacitor has a lower electrode formed on an oxide film, a dielectric layer formed on the lower electrode, an upper electrode formed so as to face the lower electrode with the dielectric layer between, and an upper electrode formed so as to cover the upper electrode, an opening portion of the upper electrode and an opening portion of the dielectric layer. By forming the upper electrode on the dielectric layer, it is possible to pattern the dielectric layer by using the upper electrode as a mask, and provide a capacitor having a high-quality dielectric layer by preventing impurity diffusion into the dielectric layer. By forming the upper electrode on the dielectric layer, it is possible to prevent the dielectric layer from being exposed to etching liquid, liquid developer, etc.

6 Claims, 5 Drawing Sheets

U.S. PATENT DOCUMENTS

| | | | |
|---|---|---|---|
| 5,728,603 A * | 3/1998 | Emesh et al. | 438/3 |
| 5,912,044 A | 6/1999 | Farooq et al. | |
| 6,100,133 A * | 8/2000 | Norstrom et al. | 438/250 |
| 6,370,012 B1 | 4/2002 | Adae-Amoakoh et al. | |
| 6,724,611 B1 | 4/2004 | Mosley | |
| 6,815,762 B2 * | 11/2004 | Yoshida et al. | 257/323 |

OTHER PUBLICATIONS

Notification of Reasons for Rejection mailed on Nov. 22, 2011, from the Japanese Patent Office in counterpart Japanese Patent Application No. 2005-243180 (3 pages).

* cited by examiner

CAPACITOR AND MANUFACTURING METHOD THEREOF

BACKGROUND OF THE INVENTION

1. Field of the Invention

The present invention relates to a capacitor and a manufacturing method thereof.

2. Description of the Related Art

Conventionally, it has been practiced to connect a capacitor between an electrode terminal and a ground terminal of an element of a semiconductor integrated circuit, with a view to suppressing noises, etc. caused in an electronic circuit and stably operating a semiconductor integrated circuit device or the like. Further, as described in, for example, Unexamined Japanese Patent Application KOKAI Publication No. 2005-123250, there has also been developed a technique for forming such a capacitor between a semiconductor chip and a wiring substrate, or in an interposer used as an intermediate substrate between layers of a semiconductor chip, in which substrate a connection line is formed.

SUMMARY OF THE INVENTION

According to the technique disclosed in Unexamined Japanese Patent Application KOKAI Publication No. 2005-123250, a dielectric layer is patterned, and then an upper electrode is formed on the upper surface of the dielectric layer to form a capacitor. Accordingly, since a photoresist pattern is formed on the dielectric layer in patterning the dielectric layer, impurities included in the photoresist diffuse into the dielectric layer, causing a problem that the quality of the dielectric layer deteriorates. Further, there is a problem that the surface of the dielectric layer is roughened in removing the photoresist, when the dielectric layer is entirely exposed to an etching liquid.

The technique disclosed in Unexamined Japanese Patent Application KOKAI Publication No. 2005-123250 causes quality deterioration of the dielectric layer due to such causes, resulting in a problem that a manufactured capacitor will have poor qualities, such as generation of leak currents, increase in dielectric loss, reduction in capacitance, accelerated aging degradation, etc.

The present invention was made in view of the above-described circumstance, and an object of the present invention is to provide a capacitor having a high quality and a manufacturing method thereof.

To achieve the above object, a capacitor according to a first aspect of the present invention comprises: a substrate; a lower electrode formed on one principal surface of the substrate; a dielectric layer formed on the lower electrode and having an opening portion; and an upper electrode formed on the dielectric layer so as to face the lower electrode, and the upper electrode comprises: a first layer formed on the dielectric layer and having an opening portion corresponding to the opening portion of the dielectric layer; and a second layer formed on the first layer, on the opening portion of the first layer, and on the opening portion of the dielectric layer.

To achieve the above object, a manufacturing method of a capacitor according to a second aspect of the present invention comprises: a lower electrode forming step of forming a lower electrode on a substrate; a dielectric layer forming step of forming a dielectric layer on the lower electrode; a first layer forming step of forming a first layer of an upper electrode on the dielectric layer; an opening portion forming step of forming an opening portion in the first layer; a dielectric layer opening portion forming step of forming an opening portion in the dielectric layer via the opening portion of the first layer; and a second layer forming step of forming a second layer of the upper electrode on the first layer of the upper electrode, on the opening portion of the first layer, and on the opening portion of the dielectric layer.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

A capacitor and a manufacturing method thereof according to an embodiment of the present invention will be explained with reference to the drawings. The present embodiment will be explained by particularly employing a case that a capacitor is formed in an interposer as an example.

Figure 1:
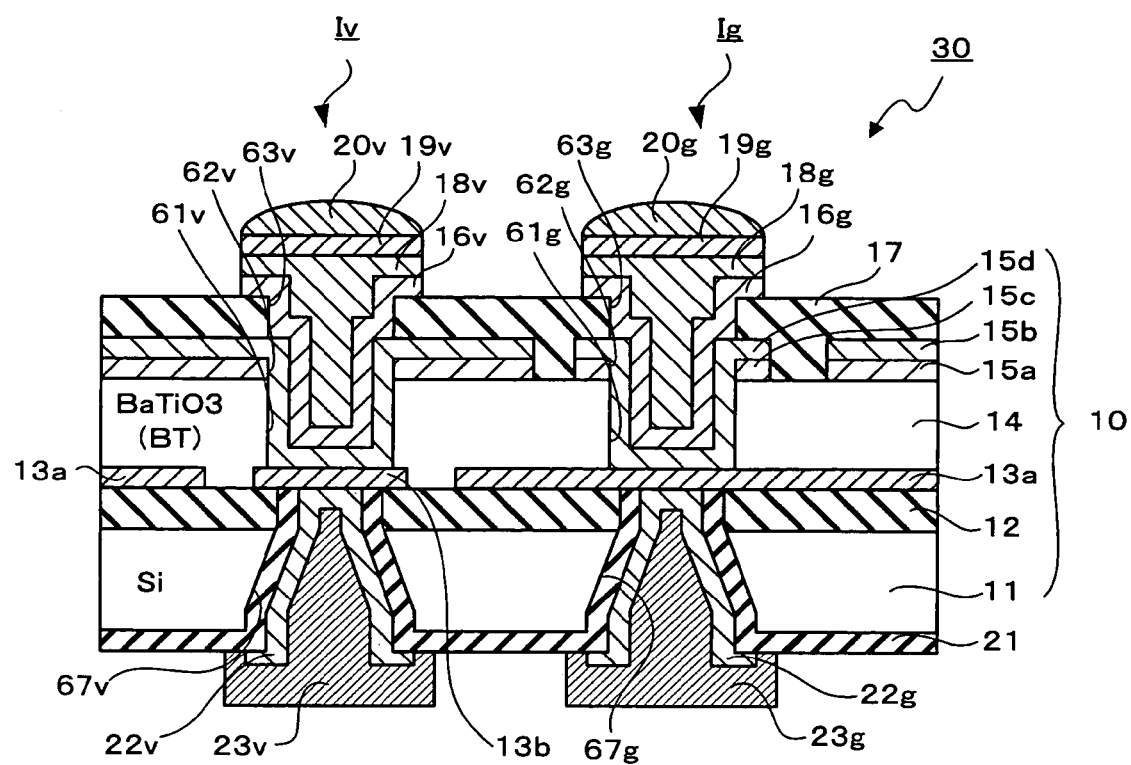
FIG. 1 is a cross sectional view showing an example of the structure of an interposer comprising a capacitor according to an embodiment of the present invention.
Figure 2:
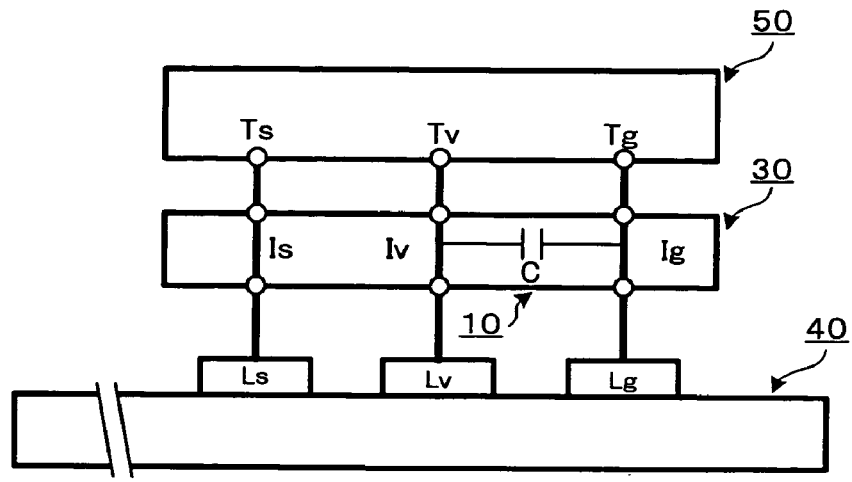
FIG. 2 is a diagram for explaining the function of the interposer shown in FIG. 1.

A capacitor 10 according to the present embodiment is formed in an interposer 30 as shown in, for example, FIG. 1. The interposer 30 is disposed between a semiconductor package (chip) 50 and a circuit substrate 40, as exemplarily shown in FIG. 2. The interposer 30 is a device which connects a power supply terminal Tv, a ground terminal Tg, and a plurality of signal terminals of the semiconductor package 50 to a power supply line Lv, a ground line Lg, and a plurality of signal lines Ls of the circuit substrate 40 by connection conductors Iv, Ig, and Is respectively, and connects a capacitor C (capacitor 10) for reducing power supply noises between the power supply terminal Tv and ground terminal Tg of the semiconductor package 50.

Figure 3:
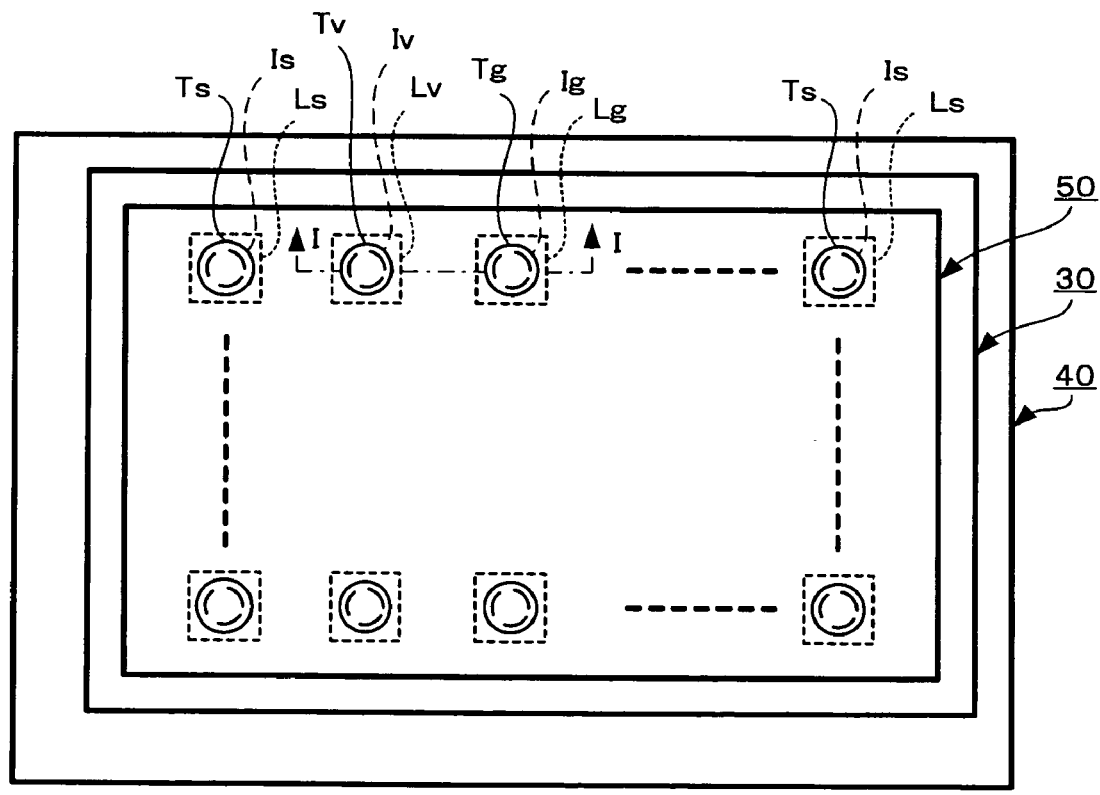
FIG. 3 is a diagram showing a positional relationship among electrodes of the interposer, a circuit substrate, and a semiconductor package.

As exemplarily shown in FIG. 3 by a plan view, the connection terminals of the semiconductor package 50, the upper and lower connection terminals of the interposer 30, and connection pads of the lines of the circuit substrate 40 are arranged at the same positions comparatively. The connection terminals of the semiconductor package 50 and the corresponding connection pads of the circuit substrate 40 are connected with the interposer 30 between, when their horizontal positions are matched to overlay the corresponding terminals. A sealing member such as a resin or the like is filled in the space between the circuit substrate 40 and the interposer 30, and in the space between interposer 30 and the semiconductor package 50, where needed.

Next, the structures of the capacitor 10 and interposer 30 comprising the same will be explained.

FIG. 1 shows a cross sectional structure of the interposer 30, which corresponds to a cross section of the plan view shown in FIG. 3 as sectioned along a line I-I. As shown in FIG. 1, the interposer 30 comprises the capacitor 10, a leading electrode layer 13$b$, metal films 16$v$ and 16$g$, an insulating film 17, electrode pads 18$g$ and 18$v$, metal layers 119 and 19$v$, bumps 20$g$ and 20$v$, an insulating layer 21, metal layers 22$g$ and 22v, and electrode pads 23g and 23v. The capacitor 10 comprises a substrate 11, an oxide film 12, a lower (lower layer) electrode 13a, a dielectric layer 14, and upper electrodes 15a and 15b.

The substrate 11 is formed of, for example, silicon monocrystal. The substrate 11 has a thickness of, for example, 50 µm, and supports the entire interposer 30. The oxide film 12 is formed on the entire upper principal surface of the substrate 11, and insulates between the substrate 11, and the lower electrode 13a and leading electrode layer 13b. The oxide film 12 is formed of a silicon oxide film ($SiO_2$) having a thickness of about 100 nm to 300 nm, formed on the entire upper principal surface of the substrate 11. The oxide film 12 is not limited to a silicon oxide film, but may be anything as long as it is an insulator.

The lower electrode 13a is formed of a conductor such as metal or the like, and specifically formed of, for example, platinum (Pt) or the like. The lower electrode 13a is formed on a region on the oxide film 12 where the capacitor C is to be formed, and on a region on the oxide film 12 where the ground connection conductor Ig is to be formed, functions as a lower electrode of the capacitor C, and is electrically connected to the ground electrode pad 23g.

The leading electrode layer 13b is formed of a conductor such as metal or the like, and specifically formed of, for example, platinum (Pt) or the like. The leading electrode layer 13b is formed on a region on the oxide film 12 where the power supply connection conductor Iv is to be formed, so as to be insulated from the lower electrode 13a. The leading electrode layer 13b is connected to the upper electrode 15b via an opening portion 62v in the upper electrode 15a and an opening portion 61v in the dielectric layer 14, thereby has a function to connect the upper electrode of the capacitor C to the power supply voltage electrode pad 23v.

The dielectric layer 14 is formed of a dielectric material having a high relative permittivity at ambient temperatures, for example, barium titanate ($BaTiO_3$), and functions as a dielectric layer for increasing the capacity of the capacitor. The dielectric layer 14 is formed to have a thickness which imparts a desired capacity and a required voltage withstand to the capacitor to be formed, for example, a thickness of 250 nm. The dielectric layer 14 has opening portions 61g and 61v in the regions corresponding to the connection conductors Iv and Ig.

The upper electrodes 15a to 15d are formed of a conductor or the like having a fine contact with the dielectric layer 14, and formed of, for example, nickel (Ni), tungsten (W), aluminum (Al) or the like. The upper electrodes 15a to 15d are formed to have a thickness of, for example, 100 nm respectively.

The upper electrode 15a is formed on a region on the dielectric layer 14 where the capacitor is to be formed, so as to face the lower electrode 13a, and has an opening portion 62v in a region where a through electrode is to be formed. The upper electrode 15b is formed so as to cover the upper electrode 15a, and to cover the entire inner walls of the opening portion 62v in the upper electrode 15a and opening portion 61v in the dielectric layer 14. Further, the upper electrode 15b is formed so as to be connected to the leading electrode layer 13b. The upper electrodes 15a and 15b are electrically connected to a power supply electrode, and constitute a capacitor together with the lower electrode 13a connected to a ground electrode and with the dielectric layer 14 formed between the upper electrodes 15a and 15b and the lower electrode 13a.

The upper electrode 15c is formed on a region on the dielectric layer 14 where the ground connection conductor Ig is to be formed, and has an opening portion 62g which communicates with an opening portion 61g in the dielectric layer 14. The upper electrode 15d is formed so as to cover the upper electrode 15c and to cover the entire inner walls of the opening portion 62g in the upper electrode 15c and opening portion 61g in the dielectric layer 14. Further, the upper electrode 15d is formed so as to be connected to the lower electrode 13a.

As will be described later, since the upper electrodes 15a and 15c function as barrier and mask when the dielectric layer 14 is to be formed, the dielectric layer 14 with a high quality can be formed. Further, the upper electrodes 15b and 15d are formed so as to cover the entire inner walls of the opening portions 61v, 62v, 61g, and 62g respectively, and can prevent the dielectric layer 14 from being roughened by an organic solvent or at a photoresist step when the insulating film 17 is to be formed as will be described later in detail.

The metal films 16v and 16g are formed of a conductor, for example, nickel (Ni). The metal film 16v is formed so as to cover the upper electrode 15b, which is formed to cover the opening portion 61v in the dielectric layer 14 and opening portion 62v in the upper electrode 15a, and to cover an opening portion 63v in the insulating film 17 and the upper surface of the insulating film 17 near the opening portion 63v. Likewise, the metal film 16g is formed to cover the upper electrode 15d, an opening portion 63g, and the upper surface of the insulating layer 17 near the opening portion 63g.

The insulating film 17 is formed of a photosensitive insulating film, and formed on the upper electrodes 15b and 15d. The insulating film 17 has the opening portions 63v and 63g in the regions corresponding to the opening portions 61v and 61g and the opening portions 62v and 62g respectively, and has the metal films 16v and 16g formed on the inner walls of the opening portions 63v and 63g respectively.

The electrode pad 18v is formed of a conductor, and formed of, for example, nickel. The electrode pad 18v is formed so as to fill the opening portions 61v, 62v, and 63v with the metal film 16v between, and to cover the metal film 16v formed on the upper surface of the insulating film 17. The electrode pad 18v functions as an electrode pad at the side of the power supply electrode. The metal layer 19v formed of, for example, gold (Au) is formed on the electrode pad 18v. The metal layer 19v is formed to protect the electrode pad 18v from corrosion. The bump 20v formed of a solder layer is formed on the metal layer 19v.

The electrode pad 18g is formed of a conductor likewise the electrode pad 18v, and formed of, for example, nickel. The electrode pad 18g is formed so as to fill the opening portions 61g, 62g, and 63g with the metal film 16g between, and to cover the metal film 16g formed on the upper surface of the insulating film 17. The electrode pad 18g functions as an electrode pad at the side of the ground electrode. The metal layer 19g formed of, for example, gold (Au) is formed on the electrode pad 18g. The bump 20g formed of a solder layer is formed on the metal layer 19g.

Opening portions 67v and 67g functioning as contact holes are formed in the regions of the substrate 11 where the connection conductors are to be formed.

The insulating layer 21 serves to insulate between the metal layers 22v and 22g, and the substrate 11, and is formed on the lower principal surface of the substrate 11 and on the inner wall of the opening portions 67v and 67g. The insulating layer 21 is formed of an insulating material, for example, polyimide.

The metal layers 22v and 22g are formed of a conductor, for example, nickel (Ni). The metal layer 22v is formed so as to cover the insulating layer 21 formed on the opening portion 67v in the substrate 11, and the metal layer 22g is formed so as to cover the insulating layer 21 formed on the opening portion 67g.

The electrode pads 23v and 23g are formed of a metal having a low resistance, for example, copper or the like, and formed so as to fill the opening portions 67v and 67g respectively. The electrode pads 23v and 23g are connected to the power supply terminal Tv and ground terminal Tg formed on the semiconductor package 50 respectively.

As described above, the capacitor 10 according to the present embodiment can, by comprising the dual-layered upper electrodes 15a to 15d as will be specifically described later, prevent diffusion of impurities included in a resist pattern into the dielectric layer 14 or prevent the surface of the dielectric layer 14 from being roughened by a liquid developer, an organic solvent, or the like at a photolithography step. Thus, the capacitor 10 according to the present embodiment comprises the dielectric layer 14 having no deterioration. Accordingly, it is possible to provide a capacitor 10 having a high quality.

Next, a manufacturing method of the capacitor 10 having the above-described structure will be explained with reference to the drawings. The manufacturing method to be described below is one example, and not the only method as long as the same resultant product can be obtained otherwise.

Figure 4A:
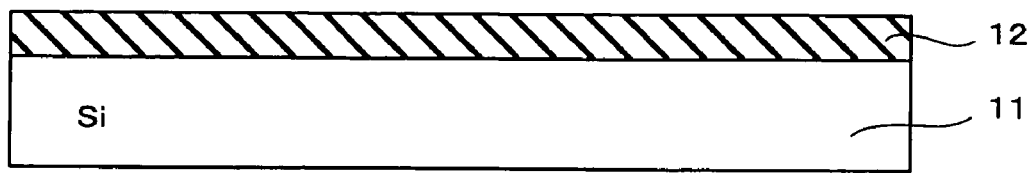
FIG. 4A to FIG. 4I are diagrams showing a manufacturing method of a capacitor according to an embodiment of the present invention.

FIG. 4A is a cross sectional view of a substrate on which a capacitor is to be formed. A substrate formed of silicon monocrystal having a thickness of, for example, 50 μm is used as the substrate 11. After stains such as dust adhered on the surface of the substrate 11 are cleaned and removed, the surface of the substrate 11 is oxidized by thermal oxidation, to form an oxide film 12 having a thickness of, for example, 100 nm to 300 nm, as shown in FIG. 4A.

Figure 4B:
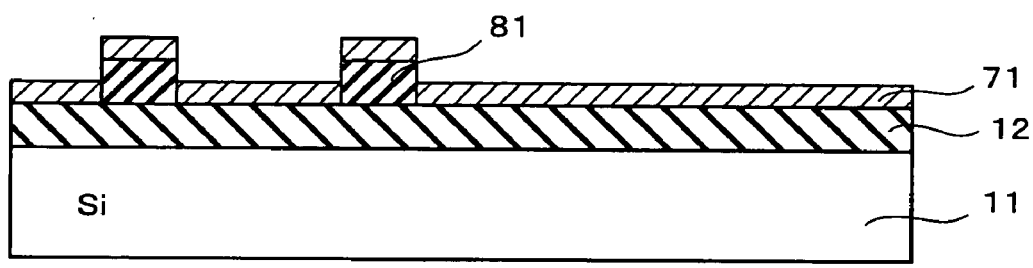

FIG. 4B is a cross sectional view of the substrate being in the process of forming lower electrodes. A resist pattern 81 is formed by photolithography or the like, on the regions on the oxide film 12, where the lower electrode 13a and the leading electrode layer 13b are not to be formed. Next, platinum (Pt) is deposited on the upper surfaces of the resist pattern 81 and oxide film 12 by sputtering, relatively thinly, for example, about 30 nm, to form a platinum layer 71.

Figure 4C:
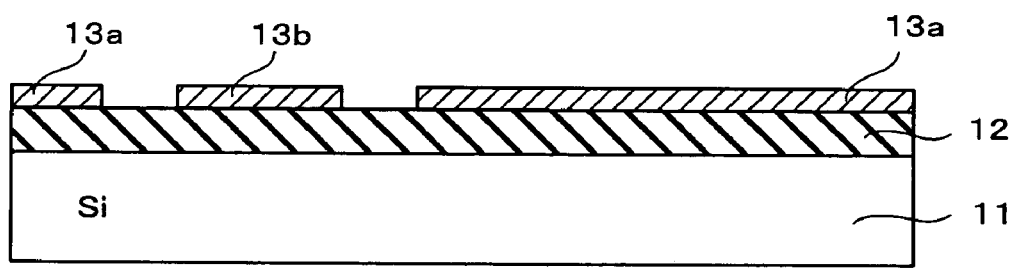

FIG. 4C is a cross sectional view of the substrate on which the lower electrodes are formed. The resist pattern 81 is removed by an etching liquid. As a result, the platinum layer 71 on the resist pattern 81 is also removed. That is, the lower electrode 13a and the leading electrode layer 13b are formed on the oxide film 12 by liftoff technique.

Figure 4D:
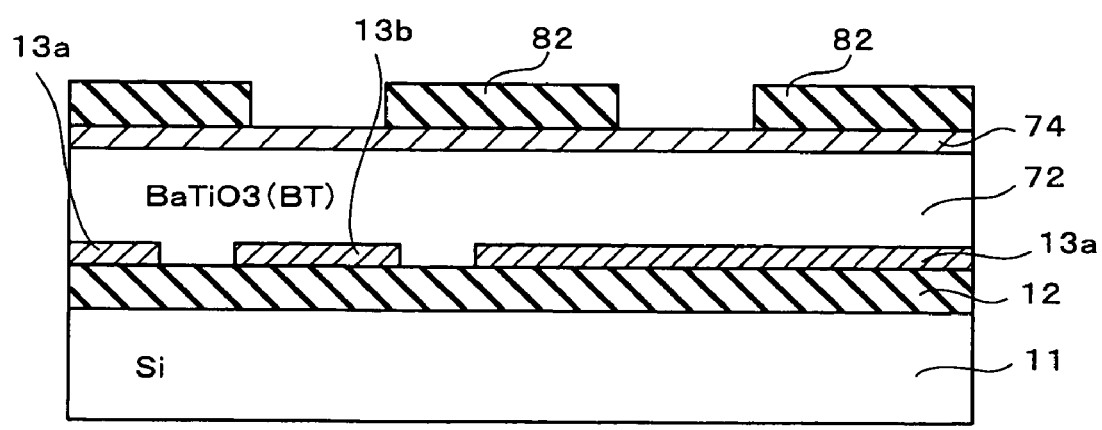

FIG. 4D is a cross sectional view of the substrate on which a barium titanate layer to be a dielectric layer, and a conductor layer to be an upper electrode are formed. A barium titanate liquid is coated by spin coating or the like on the oxide film 12, the lower electrode 13a and the leading electrode layer 13b, and provisionally burned at a temperature of 250° C. Further, the substrate 11 is burned for 60 minutes at, for example, a temperature of 750° C. to form a barium titanate layer 72 having a thickness of about 250 μm.

Next, nickel is deposed to a thickness of, for example, about 100 nm, by sputtering on the dielectric layer 14, to form a first nickel layer 74. Then, as shown in FIG. 4D, a resist pattern 82 having openings in the regions where the power supply connection conductor Iv and ground connection conductor Ig are to be formed is formed on the first nickel layer 74 by photolithography or the like.

Figure 4E:
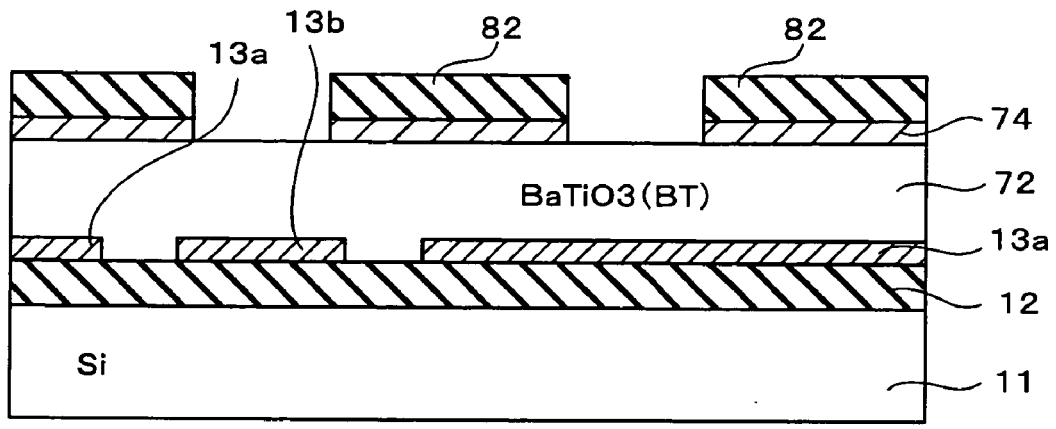

FIG. 4E is a cross sectional view of the substrate having opening portions formed in the conductor layer, which is to be the upper electrode. As shown in FIG. 4E, with the resist pattern 82 used as a mask, the regions in the first nickel layer 74 that correspond to the electrode pads 18v and 18g are etched out by an etching liquid. An etching liquid which only etches the first nickel layer 74 but not the barium titanate layer 72 is preferred, and, for example, a ferric chloride ($FeCi_3$) liquid is used. As a result, the opening portions 62v and 62g are formed.

Figure 4F:
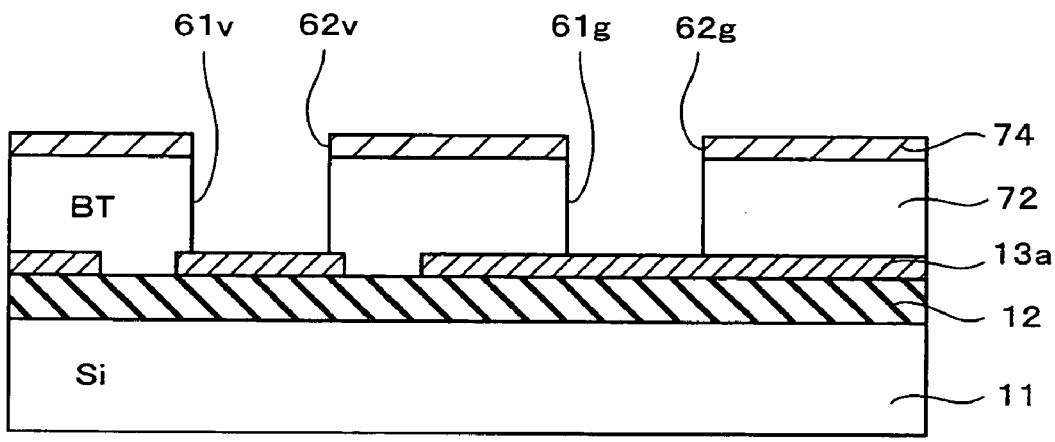

FIG. 4F is a cross sectional view of the substrate having a dielectric layer and its opening portions formed. The resist pattern 82 of FIG. 4E is removed. With the first nickel layer 74 used as a mask, the barium titanate layer 72, which is exposed in the opening portions is etched out by using, for example, rare hydrofluoric acid (HF). As a result, the opening portions 61v and 61g of the dielectric layer 14 are formed to be self-aligned to the opening portions 62v and 62g, as shown in FIG. 4F.

With the first nickel layer 74 used as a mask, there is no need of forming a further resist pattern on the barium titanate layer 72, achieving no increase in the number of steps required. Further, it is possible to prevent defects that might be caused in the dielectric layer 14, such as diffusion of impurities included in the resist pattern into the barium titanate layer 72, the surface roughening by a liquid developer or the like. Note that the removal of the resist pattern 82 at this step may be carried out after the barium titanate layer 72 is etched.

Here, the lower electrode 13a and the leading electrode layer 13b function as etching stopper when the barium titanae layer 72 is etched. As shown in FIG. 1, the metal layer 22v and the upper electrode 15b are electrically connected to each other with the leading electrode layer 13b between. Accordingly, the leading electrode layer 13b may be omitted. Wire laying in the interposer 30 may be adjusted in order to structure the circuit such that the electrode pads 23v and 23g are connected to the upper electrode 15b and the upper electrode 15d is not connected to the lower electrode 13a.

Figure 4G:
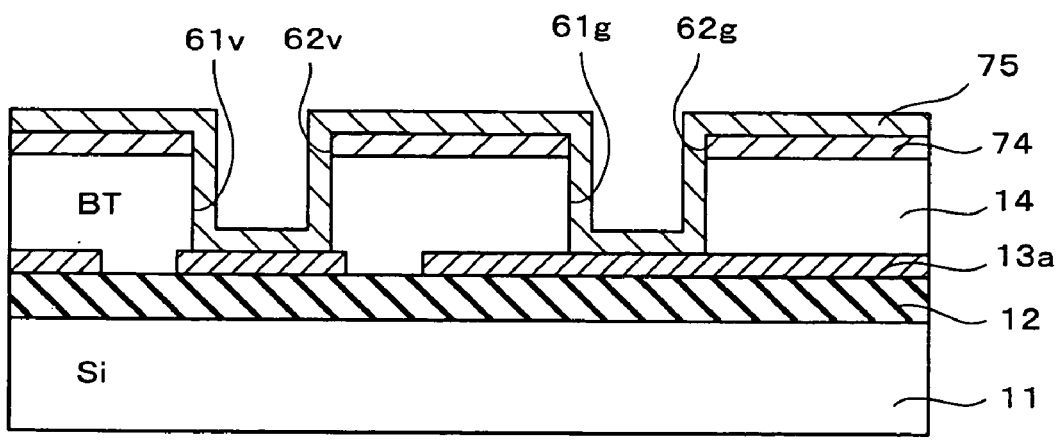

FIG. 4G is a cross sectional view of the substrate on which a second conductor layer is formed. Nickel is deposited to a thickness of, for example, about 100 nm by sputtering, so as to cover the first nickel layer 74 and the entire inner walls of the contact holes (opening portions 61v, 61g, 62v, and 62g) and form a second nickel layer 75 as shown in FIG. 4G.

Figure 4H:
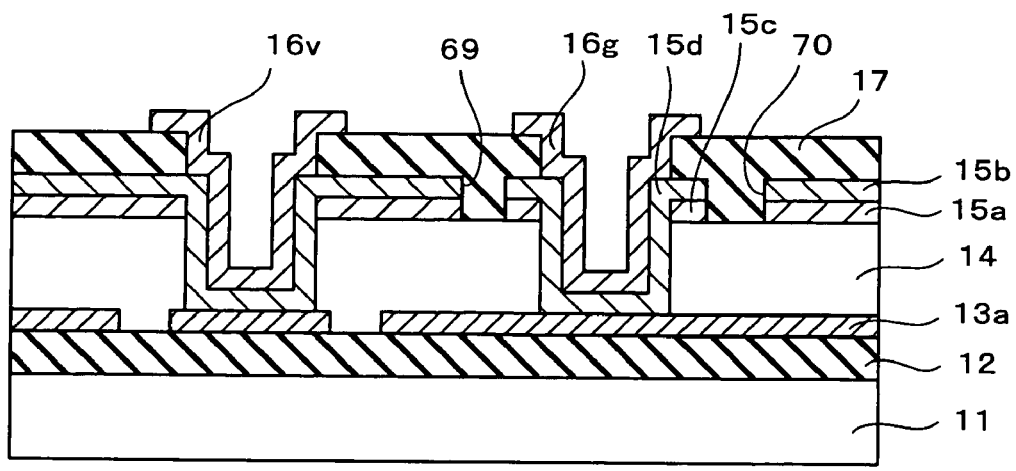

FIG. 4H is a cross sectional view of the substrate on which a capacitor is formed. After a resist pattern is formed on the second nickel layer 75 by photolithography or the like, etching using a ferric chloride liquid or the like is carried out by using the resist pattern as a mask, to form an opening portion 69 and an opening portion 70. As a result, the upper electrodes 15a and 15b, and the upper electrodes (upper lines) 15c and 15d are formed as shown in FIG. 4H.

The resist pattern is removed by ashing or the like, and a photosensitive insulating film is formed on the upper electrodes 15b and 15d, and so as to fill the opening portions 69 and 70. At this time, since the side surfaces (the opening portions 61v and 61g) of the dielectric layer 14 are covered with the upper electrodes 15b and 15d respectively, the side surfaces of the dielectric layer 14 can be prevented from being roughened by an organic solvent at the time of forming the insulating film 17 or by a liquid developer or the like at the photolithography step.

Next, nickel is deposited by sputtering on the opening portion 63v of the insulating film 17, on the upper electrode 15b exposed in the opening portion 63v, on the opening portion 63g of the insulating film 17, on the upper electrode 15d exposed in the opening portion 63g, and on the insulating film 17, and then patterned, thereby to form the metal films 16v and 16g as shown in FIG. 4H.

Figure 4I:
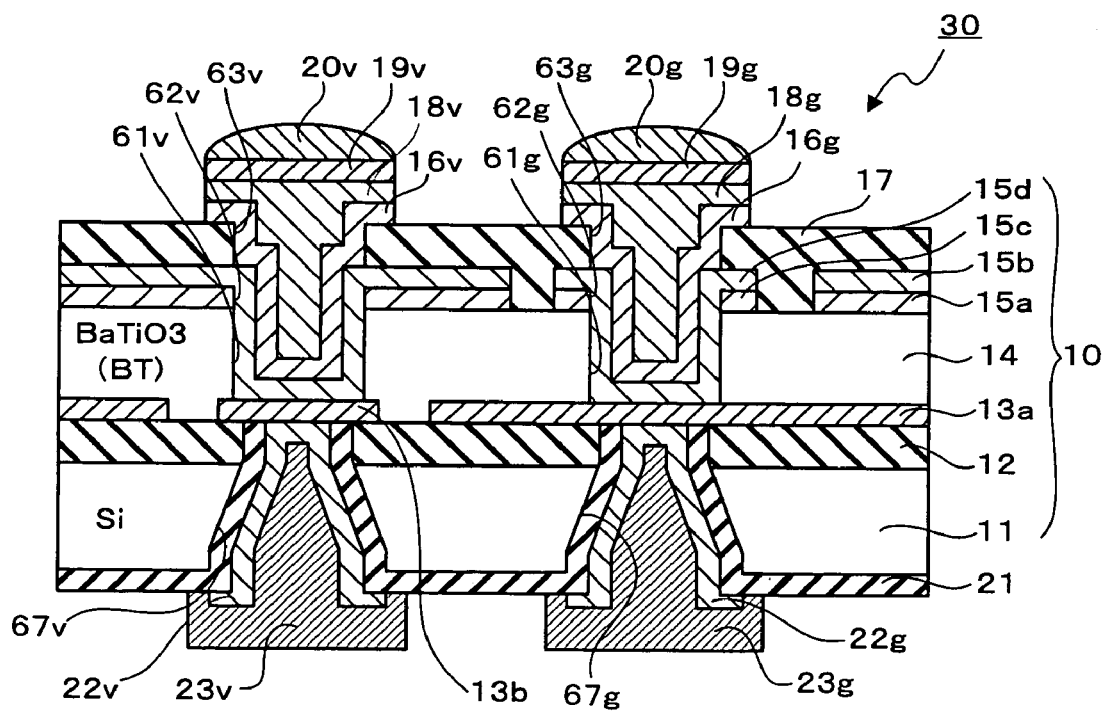

FIG. 4I is a cross sectional view of an interposer on which electrode pads are formed. The electrode pads 18v and 18g are formed by plating. The electrode pad 18v is formed so as to fill the opening portion 63v, and the electrode pad 18g is formed so as to fill the opening portion 63g. Then, the metal layers 19v and 19g each formed of gold (Au) are formed by plating on the electrode pads 18v and 18g respectively. Solder layers are formed on the metal layers 19v and 19g respectively, to form the bumps 20v and 20g.

Next, the electrode pads 23v and 23g are formed in the lower surface of the substrate 11 to obtain the interposer 30. A resist pattern is formed so as to correspond to the regions of the lower surface of the substrate 11 where the electrode pads 23v and 23g are to be formed. With the resist pattern used as a mask, isotropic etching is carried out to form the opening portions 67v and 67g having a generally conical shape.

The insulating layer 21 formed of polyimide is formed so as to cover the surface of the respective opening portions 67v and 67g and the lower surface of the substrate 11. Next, the metal layers 22v and 22g formed of nickel are formed by sputtering or the like on the insulating layer 21 formed on the opening portions 67v and 67g. Then, the electrode pads 23v and 23g formed of copper are formed by plating or the like on the metal layers 22v and 22g.

Through the above-described steps, the interposer 30 comprising the capacitor 10 is manufactured as shown in FIG. 4I.

According to the manufacturing method of the capacitor 10 of the present embodiment, the first nickel layer 74 is formed on the barium titanate layer 72, and the resist pattern 82 is formed on the first nickel layer 74. Then, after the opening portions 62v and 62g are formed in the first nickel layer 74, the resist pattern 82 is removed and the barium titanate layer 72 is etched by using the first nickel layer 74 as a mask, to thereby form the dielectric layer 14. Accordingly, the first nickel layer 74 (the upper electrodes 15a and 15c) can prevent impurities included in the resist pattern 82 from diffusing into the dielectric layer 14. Further, since the barium titanate layer 72 can be etched with the first nickel layer 74 used as a mask, there is no need of forming a resist pattern on the barium titanate layer 72 in order to form the dielectric layer 14, causing no increase in the number of manufacturing steps. Further, the dielectric layer 14 can be prevented form being roughened by a liquid developer or the like used at a photolithography step.

Further, by using the fist nickel layer 74 having been used as a mask as the upper electrodes 15a and 15c, a step of separating a mask becomes unnecessary, making it possible to obtain a reduction in the number of steps. Furthermore, since a mask separation step and the like are unnecessary, the interface between the upper electrodes 15a and 15c and the dielectric layer 14 can be maintained favorably, thereby further improving the quality of the capacitor 10.

According to the manufacturing method of the capacitor 10 of the present embodiment, by forming the second nickel layer 75 (the upper electrodes 15b and 15d) in the opening portions of the dielectric film 14, it is possible to protect the side surfaces (the opening portions 61v and 61g) of the dielectric layer 14 from an organic solvent at the time of forming the insulating layer 17, or from a liquid developer or the like at a photolithography step.

As obvious from the above, according to the present embodiment, a capacitor 10 having a high quality can be manufactured.

The present invention is not limited to the above-described embodiment, but can be modified and applied in various manners.

According to the embodiment described above, the explanation has been given by employing a case that the capacitor 10 is formed in the interposer 30 as an example. However, this is not the only case.

Further, according to the embodiment described above, the explanation has been given by employing a case that the upper electrodes 15a to 15d are formed in a dual layer structure, as an example. However, this is not the only case, but the upper electrodes may be formed in a three or more layer structure. Further, the upper electrodes may not necessarily be formed of the same material as each other, but may be formed of different materials.

The embodiment disclosed herein should be considered to be illustrative in every respect but not to be restrictive. The scope of the present invention is shown by the claims, not by the description given above, and intended to include every modification made within the meaning and scope equivalent to the claims.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2005-243180 filed on Aug. 24, 2005 and including specification, claims, drawings and summary. The disclosure of the above Japanese Patent Application is incorporated herein by reference in its entirety.

What is claimed is:

1. A manufacturing method of a capacitor, comprising:
   a lower electrode forming step of forming a lower electrode layer on a substrate;
   a dielectric layer forming step of forming a dielectric layer on said lower electrode layer, said dielectric layer formed in said capacitor;
   a first layer forming step of forming a first layer of an upper electrode on said dielectric layer;
   an opening portion forming step of forming an opening portion in said first layer;
   a dielectric layer opening portion forming step of, after formation of said first layer and said opening portion in said first layer and before formation of any of other layers on said dielectric layer of said opening portion, forming an opening portion in said dielectric layer via said opening portion of said first layer by using said first layer as an etching mask, said opening portion in said dielectric layer reaching from said first layer to said lower electrode layer; and
   a second layer forming step of forming, after formation of said opening portion in said dielectric layer, a second layer of said upper electrode on said first layer of said upper electrode, on said opening portion of said first layer, and on said opening portion of said dielectric layer, said second layer formed on and in contact with said first layer at a periphery of said opening portion of said dielectric layer, without forming another insulating layer or dielectric layer on said opening portion of said dielectric layer,
   wherein said dielectric layer forming step includes coating a dielectric and burning said coated dielectric.

2. The manufacturing method of a capacitor according to claim 1,
wherein at said second layer forming step, said second layer is formed so as to cover an entire inner wall of said opening portion of said dielectric layer.

3. The manufacturing method of a capacitor according to claim 1, wherein:
at said opening portion forming step, a resist pattern is formed on said first layer of said upper electrode, said first layer is etched with said resist pattern used as an etching mask, and said opening portion of said first layer is formed; and
said first layer of said upper electrode functions as a barrier for preventing impurities included in said resist pattern from diffusing into said dielectric layer.

4. The manufacturing method of a capacitor according to claim 2,
wherein: at said opening portion forming step, a resist pattern is formed on said first layer of said upper electrode, said first layer is etched with said resist pattern used as an etching mask, and said opening portion of said first layer is formed; and
said first layer of said upper electrode functions as a barrier for preventing impurities included in said resist pattern from diffusing into said dielectric layer.

5. The manufacturing method of a capacitor according to claim 1,
wherein at said dielectric layer opening portion forming step, said opening portion of said dielectric layer is formed by using an etching liquid while said first layer of said upper electrode formed on said dielectric layer is used as a mask and said dielectric layer is protected by said first layer.

6. The manufacturing method of a capacitor according to claim 2,
wherein at said dielectric layer opening portion forming step, said opening portion of said dielectric layer is formed by using an etching liquid while said first layer of said upper electrode formed on said dielectric layer is used as a mask and said dielectric layer is protected by said first layer.

* * * * *